(12) United States Patent
Park et al.

(10) Patent No.: US 12,266,638 B2
(45) Date of Patent: Apr. 1, 2025

(54) SEMICONDUCTOR PACKAGE

(71) Applicant: Samsung Electronics Co., Ltd., Suwon-si (KR)

(72) Inventors: Sangcheon Park, Hwaseong-si (KR); Youngmin Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 77 days.

(21) Appl. No.: 18/174,129

(22) Filed: Feb. 24, 2023

(65) Prior Publication Data

US 2023/0215843 A1 Jul. 6, 2023

Related U.S. Application Data

(63) Continuation of application No. 17/203,909, filed on Mar. 17, 2021, now Pat. No. 11,621,247.

(30) Foreign Application Priority Data

Sep. 8, 2020 (KR) .......................... 10-2020-0114963

(51) Int. Cl.
*H01L 25/065* (2023.01)
*H01L 23/00* (2006.01)
(Continued)

(52) U.S. Cl.
CPC .......... *H01L 25/0657* (2013.01); *H01L 23/12* (2013.01); *H01L 23/5385* (2013.01); *H01L 23/5386* (2013.01); *H01L 24/06* (2013.01)

(58) Field of Classification Search
CPC . H01L 2224/06142; H01L 2224/06177; H01L 2225/06541; H01L 23/5386;
(Continued)

(56) References Cited

U.S. PATENT DOCUMENTS 8,618,667 B2 12/2013 Takeda et al.
8,710,607 B2 4/2014 Chen et al.
(Continued)

FOREIGN PATENT DOCUMENTS

JP 2003-008186 A 1/2003
JP 2008-112878 A 5/2008
(Continued)

OTHER PUBLICATIONS

Notice of Allowance issued Nov. 14, 2022 in U.S. Appl. No. 17/203,909.
(Continued)

*Primary Examiner* — Victor A Mandala
*Assistant Examiner* — Lawrence C Tynes, Jr.
(74) *Attorney, Agent, or Firm* — Harness, Dickey & Pierce, P.L.C.

(57) ABSTRACT

A semiconductor package includes: a first structure having a first insulating layer disposed on one surface, and first electrode pads and first dummy pads penetrating through the first insulating layer, a second structure having a second insulating layer having the other surface bonded to the one surface and the first insulating layer and disposed on the other surface, and second electrode pads and second dummy pads that penetrate through the second insulating layer, the second electrode pads being bonded to the first electrode pads, respectively, and the second dummy pads being bonded to the first dummy pads, respectively. In the semiconductor chip, ratios of surface areas per unit area of the first and second dummy pads to the first and second insulating layers on the one surface and the other surface gradually decrease toward sides of the first and second structures.

20 Claims, 16 Drawing Sheets

(51) Int. Cl.
*H01L 23/12* (2006.01)
*H01L 23/538* (2006.01)

(58) Field of Classification Search
CPC . H01L 23/481; H01L 23/49838; H01L 23/12; H01L 23/5385; H01L 24/09; H01L 24/06; H01L 24/03; H01L 21/76898; H01L 25/0657
See application file for complete search history.

(56) References Cited

U.S. PATENT DOCUMENTS

| | | | |
|---|---|---|---|
| 8,802,538 B1 | 8/2014 | Liu et al. | |
| 9,425,126 B2* | 8/2016 | Kuo | H01L 23/528 |
| 9,613,881 B2 | 4/2017 | Ahn et al. | |
| 9,799,587 B2* | 10/2017 | Fujii | H01L 24/09 |
| 9,972,603 B2* | 5/2018 | Chu | H01L 24/19 |
| 10,157,867 B1* | 12/2018 | Chen | H01L 23/5385 |
| 10,312,201 B1* | 6/2019 | Hu | H01L 24/05 |
| 10,461,069 B2* | 10/2019 | Lin | H01L 25/0657 |
| 10,777,534 B2* | 9/2020 | Huang | H01L 21/31111 |
| 10,796,990 B2* | 10/2020 | Chen | H01L 23/3128 |
| 10,797,031 B2* | 10/2020 | Liao | G02B 6/1225 |
| 10,818,624 B2* | 10/2020 | Chen | H01L 24/06 |
| 10,840,190 B1* | 11/2020 | Yang | H01L 21/76805 |
| 11,239,225 B2* | 2/2022 | Chen | H01L 21/02271 |
| 2013/0320556 A1 | 12/2013 | Liu et al. | |
| 2014/0042299 A1 | 2/2014 | Wan et al. | |
| 2014/0117546 A1 | 5/2014 | Liu et al. | |
| 2014/0145338 A1* | 5/2014 | Fujii | H01L 23/498 257/762 |
| 2017/0200702 A1* | 7/2017 | Hung | H01L 25/50 |
| 2017/0309599 A1 | 10/2017 | Takazawa et al. | |
| 2019/0057756 A1* | 2/2019 | Kim | H01L 27/11575 |
| 2019/0157334 A1 | 5/2019 | Wei et al. | |
| 2019/0157664 A1 | 5/2019 | Yamamoto et al. | |
| 2019/0385966 A1* | 12/2019 | Gao | H01L 24/08 |
| 2020/0035641 A1* | 1/2020 | Fountain, Jr. | H01L 25/18 |
| 2020/0161263 A1* | 5/2020 | Chen | H03K 19/1776 |
| 2020/0168584 A1* | 5/2020 | Sadaka | H01L 24/80 |
| 2020/0243473 A1* | 7/2020 | Wang | H01L 24/80 |
| 2021/0202418 A1* | 7/2021 | Lin | H01L 25/50 |
| 2021/0320038 A1* | 10/2021 | Hsu | H01L 22/32 |
| 2021/0391322 A1* | 12/2021 | Chen | H01L 21/78 |

FOREIGN PATENT DOCUMENTS

| | | |
|---|---|---|
| JP | 2010-283245 A | 12/2010 |
| JP | 2018-107267 A | 7/2018 |
| KR | 10-2017-0109328 A | 9/2017 |
| KR | 10-2018-0037620 A | 4/2018 |
| KR | 10-2020-0047930 A | 5/2020 |
| TW | 201308560 A | 2/2013 |

OTHER PUBLICATIONS

Office Action issued Dec. 15, 2023 in Taiwanese Application No. 110117011.
Office Action issued on Feb. 1, 2025 in Korean Application No. 10-2020-0114963.

* cited by examiner

SEMICONDUCTOR PACKAGE

CROSS-REFERENCE TO RELATED APPLICATION(S)

This application is a Continuation of U.S. application Ser. No. 17/203,909, filed on Mar. 17, 2021, which claims the benefit under 35 USC 119(a) of Korean Patent Application No. 10-2020-0114963 filed on Sep. 8, 2020, in the Korean Intellectual Property Office, the entire disclosure of each of which is incorporated herein by reference for all purposes.

BACKGROUND

Example embodiments of the present inventive concepts relate to a semiconductor package.

With the development of the electronics industry, demands for high functionality, high speed and miniaturization of electronic components are increasing. In accordance with this trend, semiconductor packaging methods in which several semiconductor chips are stacked and mounted on a single semiconductor substrate or packages are stacked on a package are increasingly being used. However, as connection pads of semiconductor chips to be stacked become finer, the reliability of the semiconductor package in which the semiconductor chips are stacked may be reduced.

SUMMARY

Example embodiments provide a semiconductor package having improved reliability.

According to example embodiments, a semiconductor package includes a first structure including a first insulating layer, first electrode pads and first dummy pads, the first dummy pads being around the first electrode pads on a surface of the first insulating layer with the first electrode pads and the first dummy pads penetrating through the first insulating layer, the first electrode pads having a pitch of 20 µm or less, and a ratio of a surface area per unit area of the first dummy pads to the first insulating layer on the surface of the first insulating layer gradually decreasing toward a side of the first structure; and a second structure including a second insulating layer, second electrode pads and second dummy pads, the second insulating layer being bonded to the first insulating layer with the second electrode pads being around the first electrode pads on a surface of the second insulating layer bonded to the surface of the first insulating layer with the second electrode pads and the dummy pads penetrating through the second insulating layer such that the second electrode pads are bonded to the first electrode pads, respectively, and the second dummy pads being bonded to the first dummy pads, respectively, and a ratio of a surface area per unit area of the second dummy pads to the second insulating layer on the surface of the second insulating layer gradually decreases toward a side of the second structure.

According to example embodiments, a semiconductor package includes a lower structure including an upper insulating layer in a first area and a second area thereof with the second area surrounding the first area, the first area including upper electrode pads penetrating through the upper insulating layer, the second area including upper dummy pads penetrating through the upper insulating layer with a ratio of a surface area per unit area of the upper dummy pads to the upper insulating layer in the second area decreases toward a side of the lower structure; and a semiconductor chip including a lower insulating layer, lower electrode pads and lower dummy pads, the lower insulating layer being in contact with and coupled to the upper insulating layer with the lower electrode pads and the lower dummy pads penetrating through the lower insulating layer such that the lower electrode pads and the lower dummy pads are in contact with and coupled to the upper electrode pads and the upper dummy pads, respectively.

According to example embodiments, a semiconductor package includes a lower structure; and a plurality of semiconductor chips on the lower structure, the plurality of semiconductor chips including, a first semiconductor chip having a front surface and rear surface with an upper insulating layer, upper electrode pads, and upper dummy pads on the rear surface thereof with a ratio of a surface area per unit area of the upper dummy pads to the upper insulating layer on the rear surface of the first semiconductor chip gradually decreases toward a side of the first semiconductor chip, and a second semiconductor chip in direct contact with first semiconductor chip, the second semiconductor chip having a front surface and a rear surface with a lower insulating layer, lower electrode pads, and lower dummy pads on the front surface thereof such that the lower insulating layer and the upper insulating layer are in contact with and coupled to each other, the lower electrode pads and the upper electrode pads are in contact with and are coupled to each other, and the lower dummy pads and the upper dummy pads are in contact with and are coupled to each other, wherein a ratio of a surface area per unit area of the lower dummy pads to the lower insulating layer on the front surface of the second semiconductor chip gradually decreases toward a side of the second semiconductor chip.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, various example embodiments of the present disclosure will be described in detail with reference to the accompanying drawings.

Figure 1:
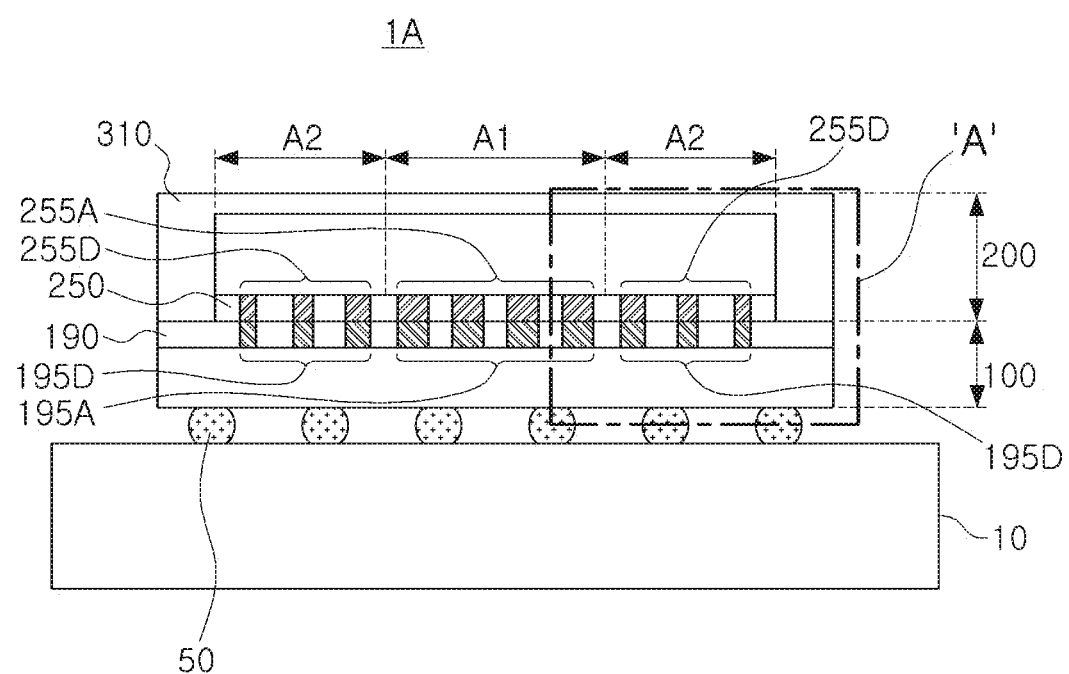
FIG. 1 is a side cross-sectional view illustrating a semiconductor package according to an example embodiment of the present disclosure.
Figure 2:
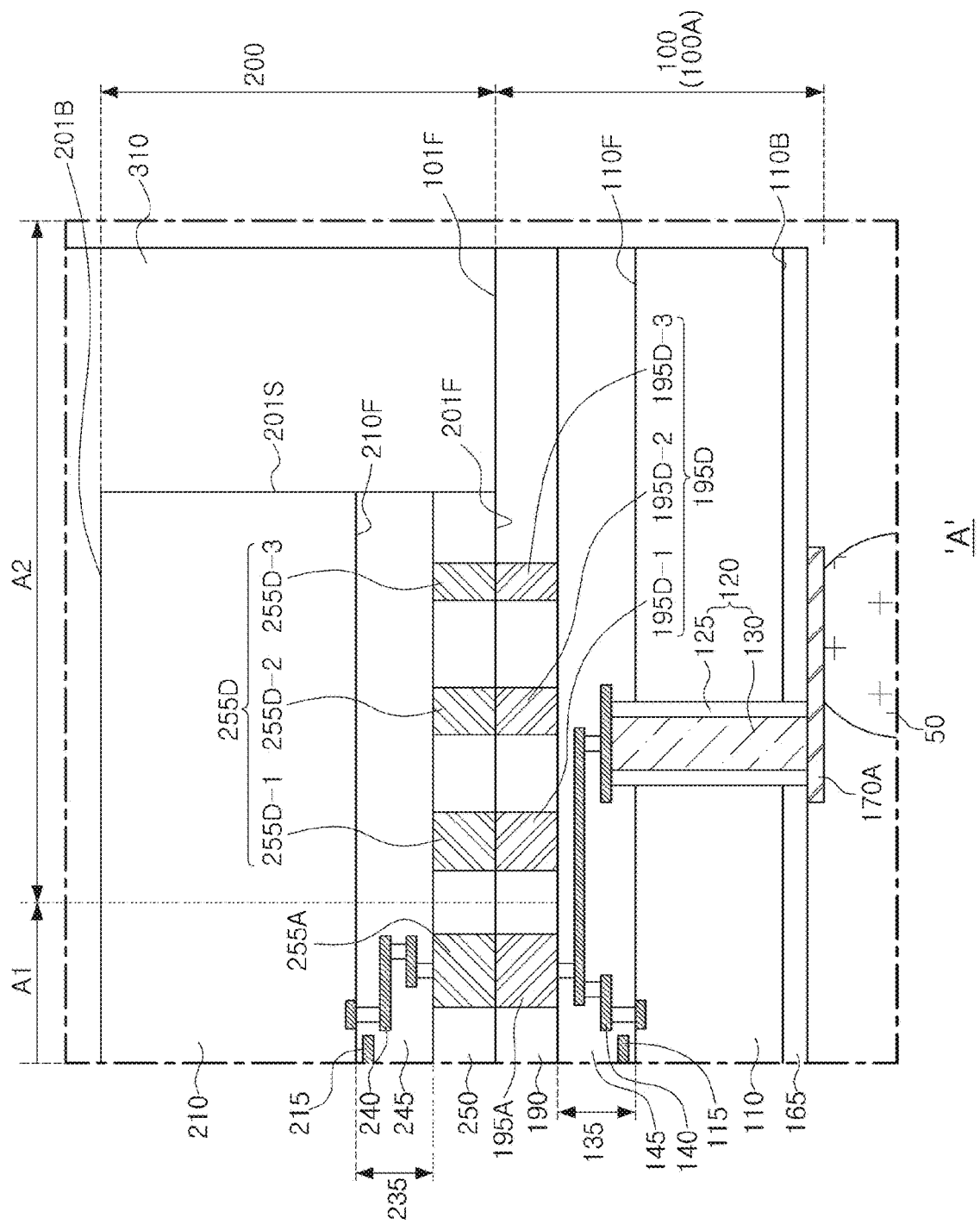
FIG. 2 is an enlarged view of portion 'A' of FIG. 1.
Figure 3:
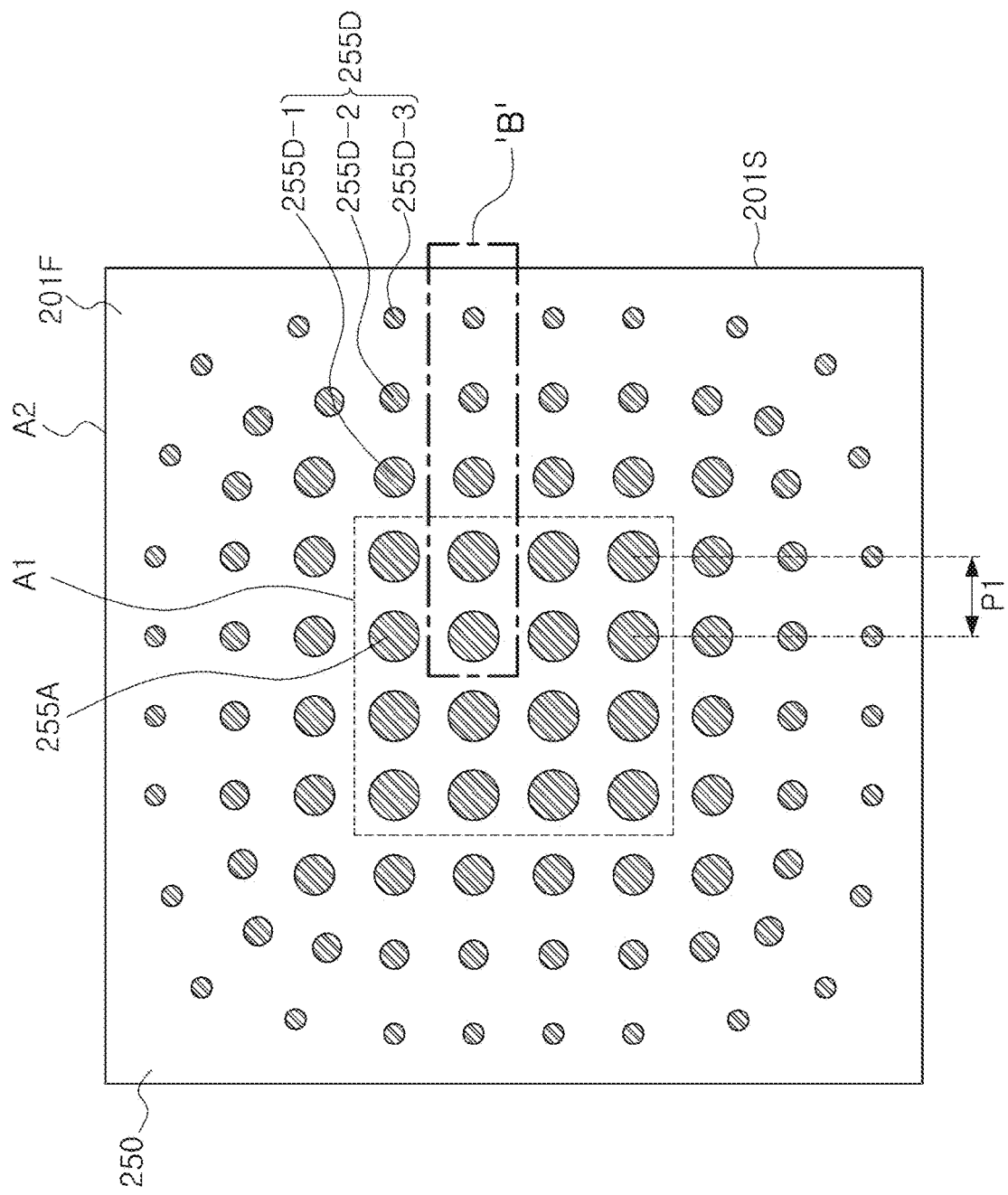
FIG. 3 is a plan view illustrating a bonding surface of a semiconductor chip disposed on an upper portion of FIG. 1.

A semiconductor package according to an example embodiment of the present disclosure will be described with reference to FIGS. 1 to 3. FIG. 1 is a side cross-sectional view illustrating a semiconductor package according to an example embodiment of the present disclosure, and FIG. 2 is an enlarged view of portion 'A' of FIG. 1. FIG. 3 is a plan view illustrating a bonding surface of a semiconductor chip disposed on an upper portion of FIG. 1.

Referring to FIG. 1, a semiconductor package 1A may include a lower structure 100 and a semiconductor chip 200 on the lower structure 100. The semiconductor chip 200 may be a memory semiconductor chip or a logic semiconductor chip. For example, the memory semiconductor chip may be a volatile memory chip such as a dynamic random access memory (DRAM) or a static random access memory (SRAM) or a non-volatile memory chip such as a phase-change random access memory (PRAM), a magnetoresistive random access memory (MRAM), a ferroelectric random access memory (FeRAM), or a resistive random access memory (RRAM), and the logic semiconductor chip may be a microprocessor, an analog device, or a digital signal processor.

In an example embodiment, the lower structure 100 may be a lower semiconductor chip different from the semiconductor chip 200. However, the example embodiments are not limited thereto. For example, the lower structure 100 may be an interposer.

Referring to FIGS. 1 and 2, the lower structure 100 may include an upper insulating layer 190, an upper electrode pad 195A, and an upper dummy pad 195D. The semiconductor chip 200 may include a semiconductor lower insulating layer 250 in contact with and coupled to the upper insulating layer 190, a semiconductor lower electrode pad 255A in contact with and coupled to the upper electrode pad 195A, and a semiconductor lower dummy pad 255D in contact with and coupled to the upper dummy pad 195D. The semiconductor chip 200 may include a side 201S.

The upper electrode pad 195A and the semiconductor lower electrode pad 255A may be coupled while being in contact with each other, and may be formed of a conductive material, for example, copper or the like.

The upper dummy pad 195D and the semiconductor lower dummy pad 255D may be coupled while being in contact with each other, and may be formed of a conductive material, for example, copper or the like. Specifically, the upper dummy pad 195D and the semiconductor lower dummy pad 255D may be formed of any one of copper, nickel, gold, and silver, or an alloy thereof.

The upper insulating layer 190 and the semiconductor lower insulating layer 250 may be coupled while being in contact with each other and may be formed of an insulating material, for example, silicon oxide. However, the upper insulating layer 190 and the semiconductor lower insulating layer 250 are not formed only of the silicon oxide, but may also be formed of SiCN or the like.

The semiconductor package 1A may further include a mold layer 310 disposed on the lower structure 100 and covering the semiconductor chip 200.

The semiconductor package 1A may further include a base 10 below the lower structure 100 and a connection structure 50 that physically connects the base 10 and the lower structure 100. The base 10 may be a printed circuit board, an interposer, or a semiconductor chip. The connection structure 50 may be a solder ball or a bump.

Referring to FIGS. 1 to 3, the semiconductor chip 200 described above may have a front surface 201F in contact with the lower structure 100 and a rear surface 201B disposed on an opposite side to the front surface 201F. The front surface 201F of the semiconductor chip 200 may be in contact with and coupled to the lower structure 100. A side 201S of the semiconductor chip 200 may extend in a direction substantially perpendicular to a rear surface 201B from an edge of the rear surface 201B.

The semiconductor chip 200 may include a semiconductor body 210, a semiconductor internal circuit area 235 below the semiconductor body 210, the semiconductor lower insulating layer 250 below the semiconductor internal circuit area 235, the semiconductor lower electrode pad 255A, and the semiconductor lower dummy pad 255D.

The semiconductor body 210 may be a semiconductor substrate, and the semiconductor internal circuit area 235 may be disposed on a front surface 210f of the semiconductor body 210.

The semiconductor internal circuit area 235 may include a semiconductor internal circuit 215 and a semiconductor internal wiring 240 electrically connecting the semiconductor internal circuit 215 and the semiconductor lower electrode pad 255A. The semiconductor internal circuit 215 and the semiconductor internal wiring 240 may be disposed in a semiconductor internal insulating layer 245.

The semiconductor lower electrode pad 255A and the semiconductor lower dummy pad 255D may each penetrate through the semiconductor lower insulating layer 250 and form the front surface 201F, which is coplanar, together with the semiconductor lower insulating layer 250.

Referring to FIG. 3, the semiconductor lower electrode pad 255A may be arranged in a first area A1 that is a central area of the front surface 201F of the semiconductor chip 200. The semiconductor lower dummy pad 255D may be arranged in a second area A2 that is a circumferential area of the first area A1.

Figure 4A:
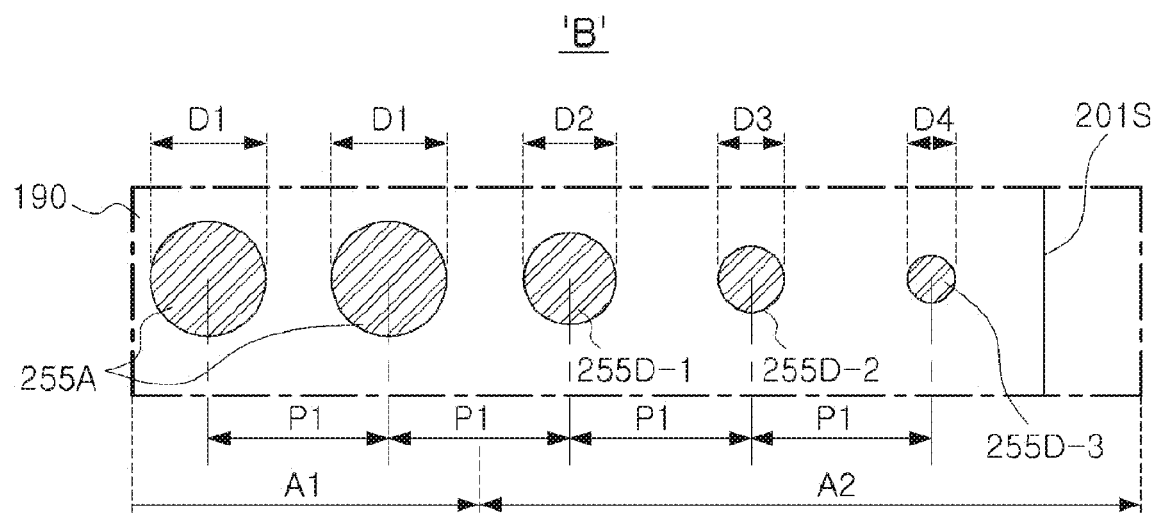
FIG. 4A is an enlarged view of portion 'B' of FIG. 3.

Referring to FIG. 4A, the semiconductor lower electrode pads 255A may be arranged to be spaced apart from each other at a first pitch P1 having substantially the same distance, and each may have a first size D1 having substantially the same size. In an example embodiment, the first pitch P1 may be in the range of 20 μm or less, for example, in the range of 10 μm to 20 μm. The pitch may correspond to a distance between neighboring patterns, such as neighboring wires, such as the distance between center-lines of neighboring patterns. The pitch may correspond to a periodic distance, e.g. a repeating distance between the center-lines of neighboring patterns; however, example embodiments are not limited thereto, and the pitch may correspond to a center-to-center distance between only two neighboring patterns.

In addition, the semiconductor lower dummy pad 255D may be arranged to have sizes D2, D3, and D4 gradually decreasing from a boundary between the first area A1 and the second area A2 toward the side 201S of the semiconductor chip 200, and may be arranged to be spaced apart from the semiconductor lower electrode pad 255A at the same first pitch P1.

In this manner, since the semiconductor lower dummy pad 255D becomes smaller and smaller toward the side 201S of the semiconductor chip 200, a pad density, which is a ratio of a surface area per unit area of the semiconductor lower dummy pad 255D and the semiconductor lower insulating layer 250, may gradually decrease from the boundary with the first area A1 toward the side 201S of the semiconductor chip 200. For example, the ratio of the surface area per unit area of the semiconductor lower dummy pad 255D and the semiconductor lower insulating layer 250 may gradually decrease like 0.1, 0.09, and 0.08 from the boundary with the first area A1 toward the side 201S of the semiconductor chip 200. Accordingly, within the range that satisfies the condition that the ratio of the surface area per unit area of the semiconductor lower dummy pad 255D and the semiconductor lower insulating layer 250 gradually decreases toward the side 201S of the semiconductor chip 200, the size and pitch of the semiconductor lower dummy pad 255D may be variously modified. For example, the size of the semiconductor lower dummy pad 255D may be selected within the range of 0.06 μm to 0.1 μm, and the pitch of the semiconductor lower dummy pad 255D may be selected within the range of 0.3 μm to 0.5 μm. Further, about 30,000 semiconductor lower dummy pads 255D may be arranged when the size of the semiconductor chip 200 has 1 cm×1 cm, and the size of the semiconductor lower electrode pad 255A is 10 μm.

Figure 4B:
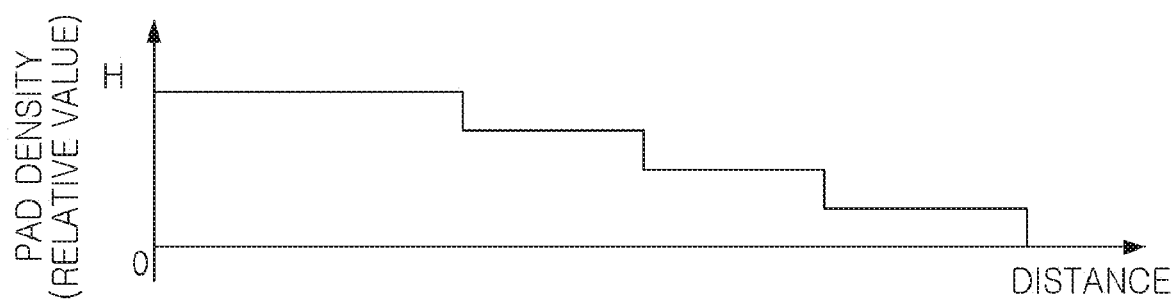
FIG. 4B is a graph illustrating a pad density of FIG. 4A.

FIG. 4B illustrates the pad densities of the first area A1 and the second area A2 in portion 'B' illustrated in FIG. 4A. It may be seen that the pad density of the first area A1 has a constant density value H, but the pad density of the second area A2 gradually decreases stepwise.

Figure 5:
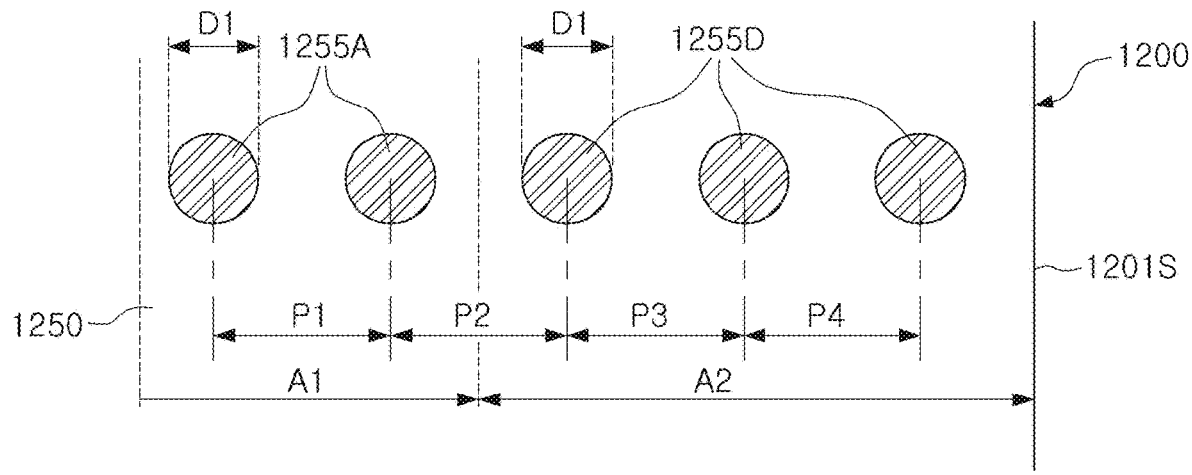
FIGS. 5 and 6 are a modified examples of FIG. 4A.
Figure 6:
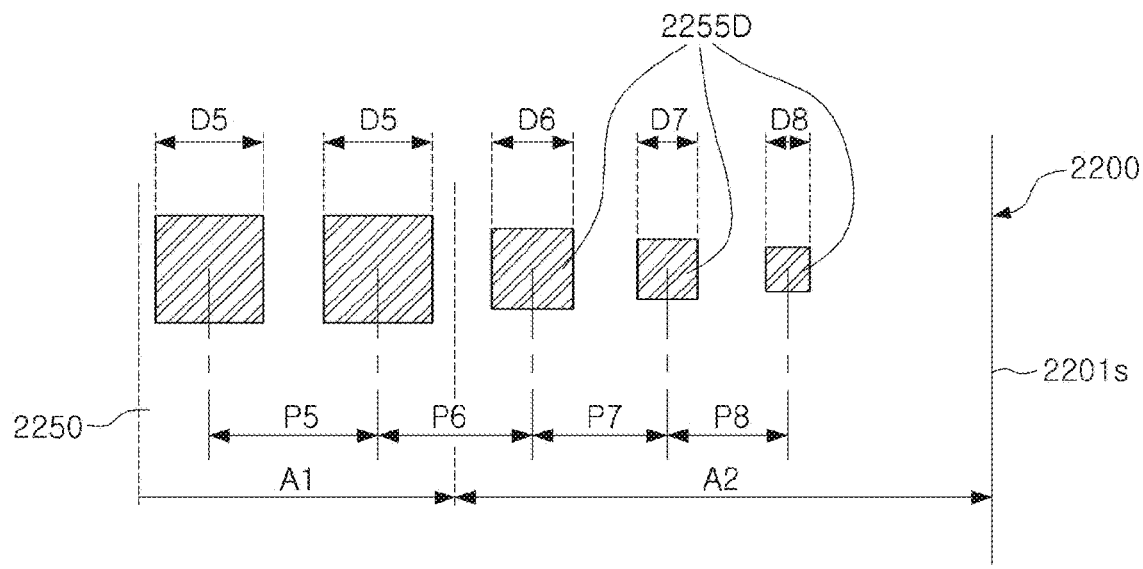

FIGS. 5 and 6 are diagrams illustrating various modified examples of the semiconductor lower dummy pad.

FIG. 5 illustrates a case in which a size D1 of a semiconductor lower dummy pad 1255D in the second area A2 is fixed and pitches P2, P3, and P4 gradually increases. Accordingly, the pad density of the second area A2 may gradually decrease from the boundary between the first area A1 and the second area A2 toward a side 1201S of a semiconductor chip 1200. In the first area A1, the pitch P1 between the semiconductor lower electrode pads 1255A and the distance between the semiconductor lower electrode pad 1255A and the semiconductor lower dummy pad 1255D may be substantially the same.

FIG. 6 illustrates an example in which, in the second area A2, sizes D6, D7, and D8 of a semiconductor lower dummy pad 2255D are gradually decreased and pitches P6, P7, and P8 also gradually decreases, the pad density in the second area A2 gradually decreases from the boundary between the first area A1 and the second area A2 toward a side 2201S of a semiconductor chip 2200. The pad density increases as the pitches P6, P7, and P8 of the semiconductor lower dummy pad 2255D decrease, but the decrease in the pad density due to the decrease in the sizes D6, D7, and D8 of the semiconductor lower dummy pad 2255D is greater than the increase in the pad density due to the decrease in the pitches P6, P7, and P8, and as a result, the pad density gradually decreases.

The lower structure 100 described in FIG. 1 may be a lower structure 100A that includes a lower body 110, a lower protective insulating layer 165 and a lower connection pad 170A below the lower body 110, a lower internal circuit area 135 on the lower body 110, and the upper insulating layer 190, the upper electrode pad 195A, and the upper dummy pad 195D on the lower internal circuit area 135. The upper electrode pad 195A and the upper dummy pad 195D may be directly connected to the semiconductor lower electrode pad 255A and the semiconductor lower dummy pad 255D of the semiconductor chip 200, respectively. Accordingly, the upper electrode pad 195A and the upper dummy pad 195D may be arranged to correspond to the semiconductor lower electrode pad 255A and the semiconductor lower dummy pad 255D of the semiconductor chip 200, respectively. Since the arrangement of the upper electrode pad 195A and the upper dummy pad 195D is the same as the semiconductor lower electrode pad 255A and the semiconductor lower dummy pad 255D of the semiconductor chip 200 described above, a detailed description thereof will be omitted.

The lower body 110 may be a semiconductor substrate such as a silicon substrate. The lower internal circuit area 135 may be disposed on a front surface 110F of the lower body 110, and the lower protective insulating layer 165 and the lower connection pad 170A may be disposed on a rear surface 110B of the lower body 110.

The lower structure 100A may include a through electrode structure 120 that penetrates through the lower body 110 and electrically connects the lower connection pad 170A and the upper electrode pad 195A. The through electrode structure 120 may include a through electrode 130 formed of a conductive material such as copper, and an insulating spacer 125 surrounding a side of the through electrode 130.

The lower internal circuit area 135 may include a lower internal circuit 115 and a lower internal wiring 140 electrically connecting the lower internal circuit 115 and the upper electrode pad 195A. The lower internal circuit 115 and the lower internal wiring 140 may be disposed in a lower internal insulating layer 145.

Accordingly, the lower structure 100A may be a semiconductor chip including the lower internal circuit area 135 facing the semiconductor chip 200.

Figure 7:
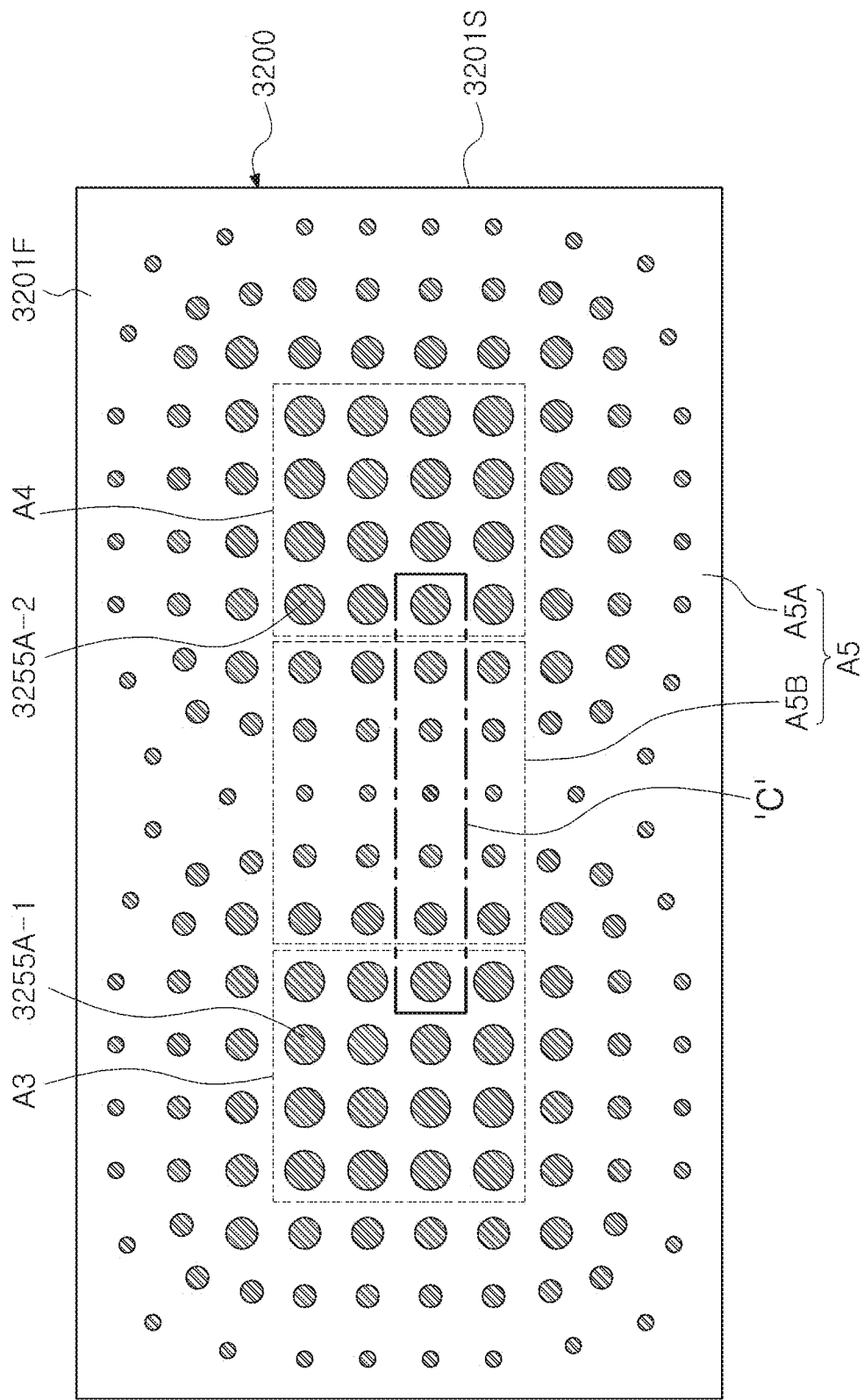
FIG. 7 is a plan view illustrating a modified example of the semiconductor chip illustrated in FIG. 3.
Figure 8:
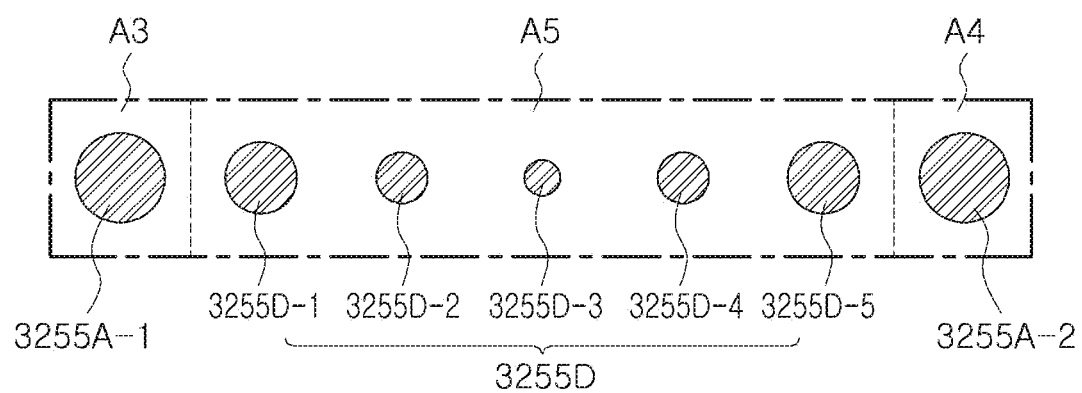
FIG. 8 is an enlarged view of part 'C' of FIG. 7.

FIG. 7 is a plan view illustrating a modified example of the semiconductor chip illustrated in FIG. 3, and FIG. 8 is an enlarged view of part 'C' of FIG. 7. FIG. 7 illustrates a case in which a plurality of first areas A3 and A4 in which semiconductor lower electrode pads 3255A are arranged are disposed on a front surface 3201F of one semiconductor chip 3200. Even when the plurality of first areas A3 and A4 are disposed on one semiconductor chip 3200, the fact that a pad density of a first portion A5A of the second area A5 disposed at an edge of the semiconductor chip 3200, that is, a ratio of a surface area per unit area of a semiconductor lower dummy pad 3255D and a semiconductor lower insulating layer 3250 gradually decreases from a boundary between the first areas A3 and A4 toward a side 3201S of the semiconductor chip 3200 is the same as the above-described example embodiment. However, a pad density of a second portion A5B of the second area A5 disposed between the first areas A3 and A4 may gradually decrease and then increase.

Specifically, as illustrated in FIG. 8, when the semiconductor lower dummy pads 3255D are arranged at the same pitch, the size of the semiconductor lower dummy pad 3255D may gradually decrease and then increase between the first areas A3 and A4.

Figure 9:
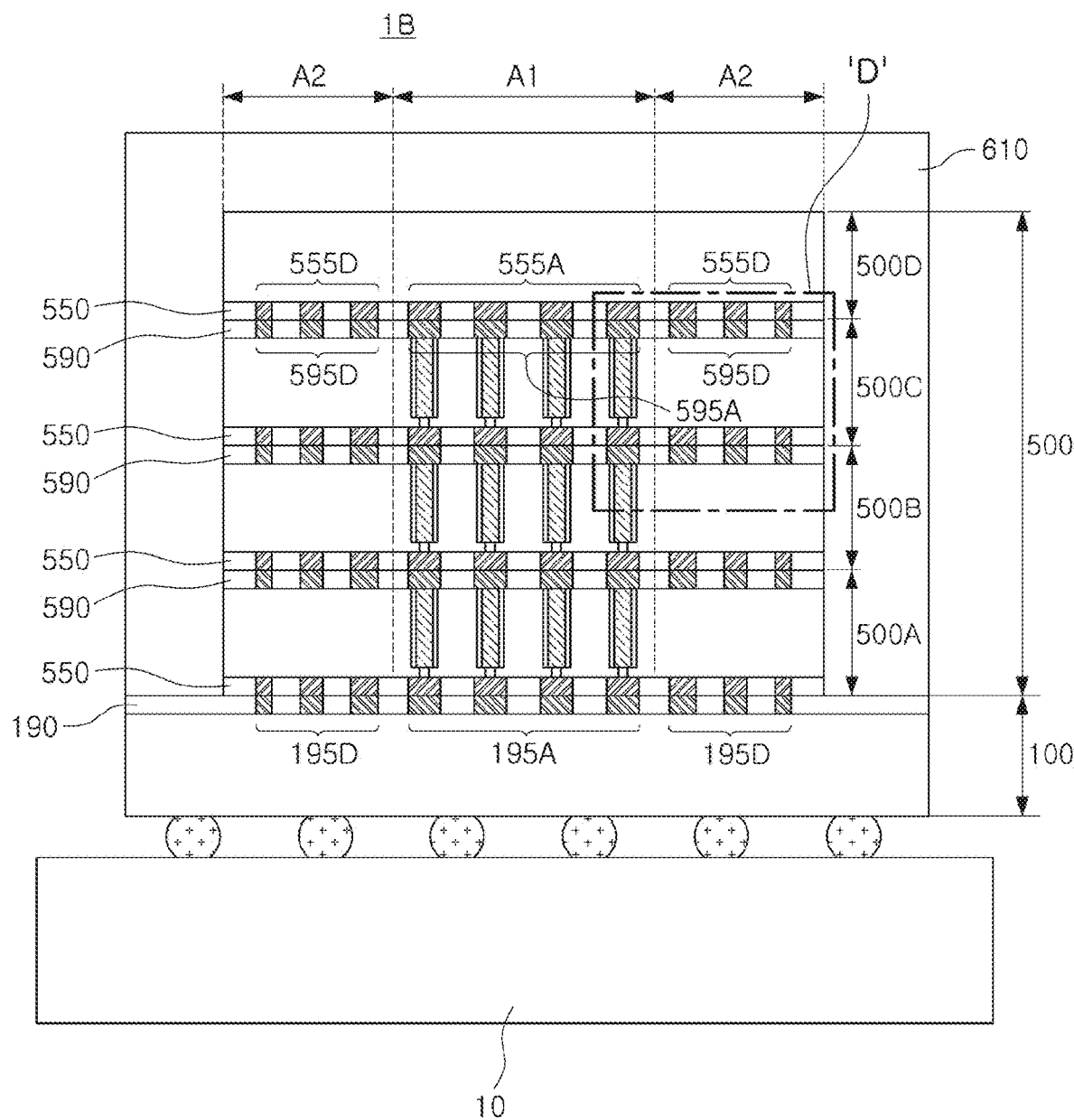
FIG. 9 is a side cross-sectional view illustrating the semiconductor package according to the example embodiment of the present disclosure.

Next, a modified example of the semiconductor package according to the example embodiment of the present disclosure will be described with reference to FIGS. 9 and 10. FIG. 9 is a cross-sectional view illustrating the semiconductor package according to the example embodiment of the present disclosure, and FIG. 10 is an enlarged view of part 'D' of FIG. 9.

Figure 10:
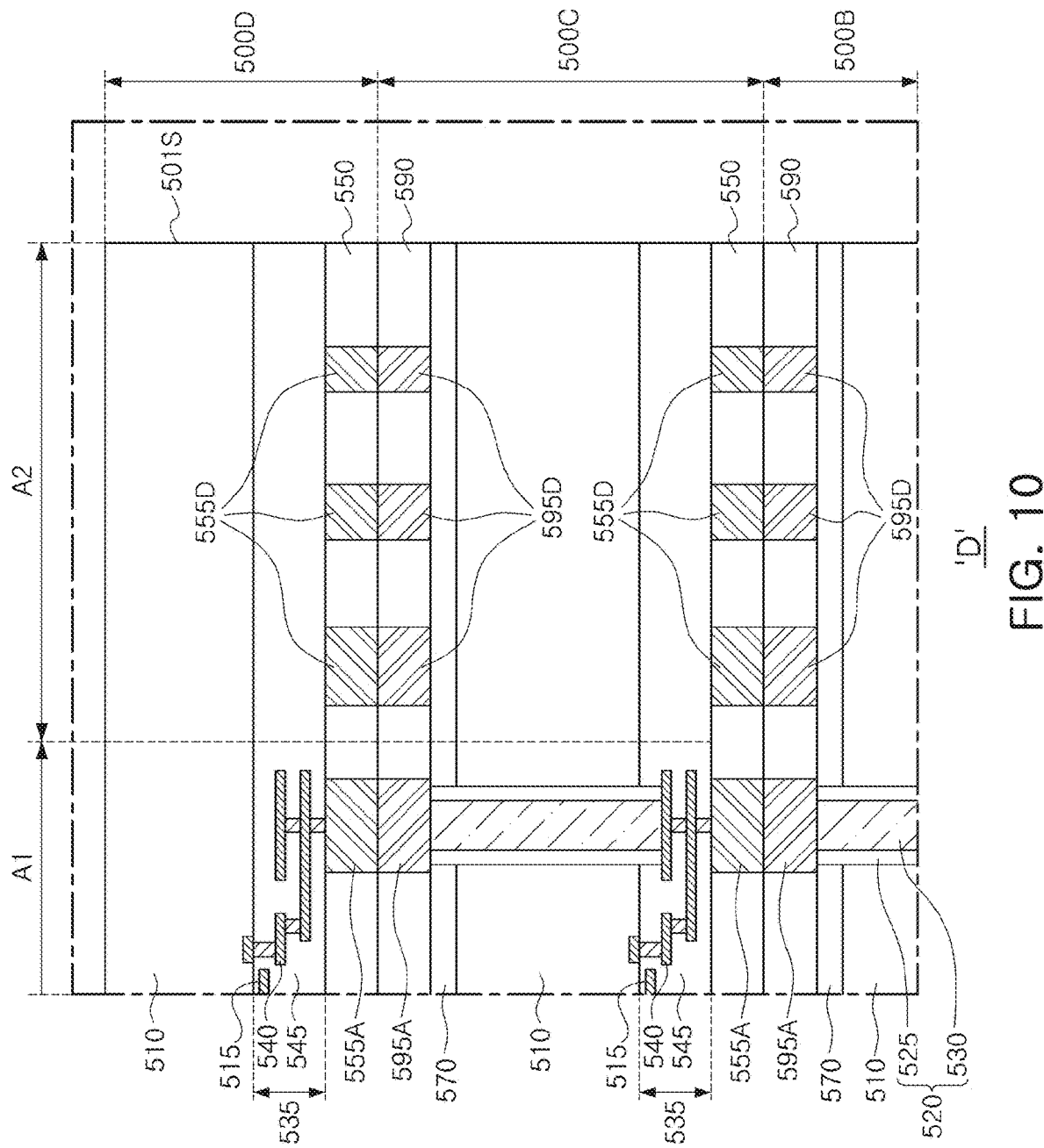
FIG. 10 is an enlarged view of part 'D' of FIG. 9.

Referring to FIGS. 9 and 10, a semiconductor package 1B may include the base 10, the lower structure 100 coupled to the base 10 by the connection structure 50 on the base 10, and a plurality of semiconductor chips 500 on the lower structure 100. The semiconductor package 1B may further include a mold layer 610 covering sides 501S of the plurality of semiconductor chips 500.

In example embodiment, the base 10 may be a printed circuit board or a semiconductor chip.

In an example embodiment, the lower structure 100 may be the same as the lower structure described in FIG. 1.

In an example embodiment, the plurality of semiconductor chips 500 may include one or more lower semiconducchips 500A, 500B, and 500C and an upper semiconductor chip 500D on one or more lower semiconductor chips 500A, 500B, and 500C.

In an example embodiment, in the case of the plurality of lower semiconductor chips 500A, 500B, and 500C, the plurality of lower semiconductor chips 500A, 500B, and 500C may have the same shape or the same structure.

Each of the plurality of semiconductor chips 500 may include a semiconductor body 510, a semiconductor internal circuit area 535 below the semiconductor body 510, a semiconductor lower insulating layer 550 below the semiconductor internal circuit area 535, a semiconductor lower electrode pad 555A, and a semiconductor lower dummy pad 555D. The semiconductor body 510 may be a semiconductor substrate such as a silicon substrate. The semiconductor internal circuit area 535 may include a semiconductor internal circuit 515 and a semiconductor internal wiring 540 electrically connecting the semiconductor internal circuit 515 and the semiconductor lower electrode pad 555A. The semiconductor internal circuit 515 and the semiconductor internal wiring 540 may be disposed in a semiconductor internal insulating layer 545.

Of the plurality of semiconductor chips 500, each of the lower semiconductor chips 500A, 500B, and 500C may further include a semiconductor upper insulating layer 590, a semiconductor upper electrode pad 595A, and a semiconductor upper dummy pad 595D on the semiconductor body 510. Of the plurality of semiconductor chips 500, each of the lower semiconductor chips 500A, 500B, and 500C may further include a semiconductor protective insulating layer 570 between the semiconductor body 510 and the semiconductor upper insulating layer 590.

Since the arrangement of the semiconductor upper electrode pad 595A and the semiconductor upper dummy pad 595D is the same as the above-described example embodiment, a detailed description thereof will be omitted. In addition, the arrangement of the semiconductor lower electrode pad 555A and the semiconductor lower dummy pad 555D is the same as the above-described example embodiment, a detailed description thereof will be omitted.

Each of the lower semiconductor chips 500A, 500B, and 500C may further include a semiconductor through electrode structure 520 penetrating through the semiconductor body 510 and electrically connecting the semiconductor lower electrode pad 555A and the semiconductor upper electrode pad 595A. The through electrode structure 520 may include a through electrode 530 formed of a conductive material such as copper, and an insulating spacer 525 surrounding a side of the through electrode 530.

Of the semiconductor chips 500, the semiconductor upper insulating layer 590 of the semiconductor chip located relatively below and the semiconductor lower insulating layer 550 of the semiconductor chip located relatively above may be coupled while being in contact with each other, and the semiconductor upper electrode pad 595A located relatively below and the semiconductor lower electrode pad 555A of the semiconductor chip located relatively above may be coupled while being in contact with each other. Accordingly, the semiconductor chips 500 may be sequentially stacked so that the semiconductor upper insulating layer 590 and the semiconductor lower insulating layer 550 are coupled while being in contact with each other, and the semiconductor upper electrode pad 595A and the semiconductor lower electrode pad 555A are coupled while being in contact with each other.

The lowest semiconductor chip 500A among the lower semiconductor chips 500A, 500B, and 500C may be coupled while being in contact with the lower structure 100. For example, the semiconductor lower insulating layer 550 of the lowermost semiconductor chip 500A may be coupled while being contact with the upper insulating layer 190 of the lower structure 100, the semiconductor lower electrode pad 555A of the lowermost semiconductor chip 500A may be coupled while being in contact with the upper electrode pad 195A of the lower structure 100, and the semiconductor lower dummy pad 555D of the lowest semiconductor chip 500A may be coupled while being in contact with the upper dummy pad 195D of the lower structure 100.

Since the semiconductor package according to the example embodiments of the present inventive concepts include the above-described lower structure and semiconductor chips 100 and 200, the reliability in the bonding process may be improved.

When a semiconductor chip on which electrode pads having a fine pitch are disposed is bonded to a connection structure such as a solder ball or a bump, a squeeze out phenomenon in which the electrode pads are short-circuited by the connection structure may occur. Accordingly, in the semiconductor chip on which the electrode pads having a fine pitch are disposed, a method of surface-treating and directly bonding surfaces of an electrode pad and an insulating layer is used without an additional connection structure. In this case, when there is a step difference on the surface to be bonded, the adhesion of the semiconductor chip may decrease or voids may occur on the bonding surface, resulting in poor bonding. In order to reduce (or, alternatively, prevent) such a bonding failure, a chemical mechanical polishing (CMP) process may be performed as a planarization process to reduce a step difference between a bonded surface of a semiconductor chip to be bonded. However, when the CMP process is performed on the bonding surface, the electrode pad formed of the conductive material may be removed at a higher removal rate than the insulating layer formed of silicon oxide. Accordingly, an erosion phenomenon may occur in which an area in which a relatively large number of electrode pads are disposed on the bonding surface is concave, and an area in which the electrode pad is relatively small is convex, resulting in the step difference on the bonding surface.

In contrast, in one or more example embodiments, in order to alleviate the occurrence of the step difference on the bonding surface during the CMP process, the dummy pad may be disposed in the second area A2 where the electrode pad is not disposed, and the size and distance of the dummy pad may be adjusted so that the ratio of the surface area per unit area of the dummy pad and the insulating layer gradually decreases as the distance from the first area A1 increases, so the occurrence of the erosion phenomenon due to the difference in removal rate depending on the area during the CMP process may be alleviated. Therefore, compared to the case in which the dummy pad is not disposed, the size of the step difference occurring during the CMP process may be reduced, for example, to 59.8%.

Figure 11:
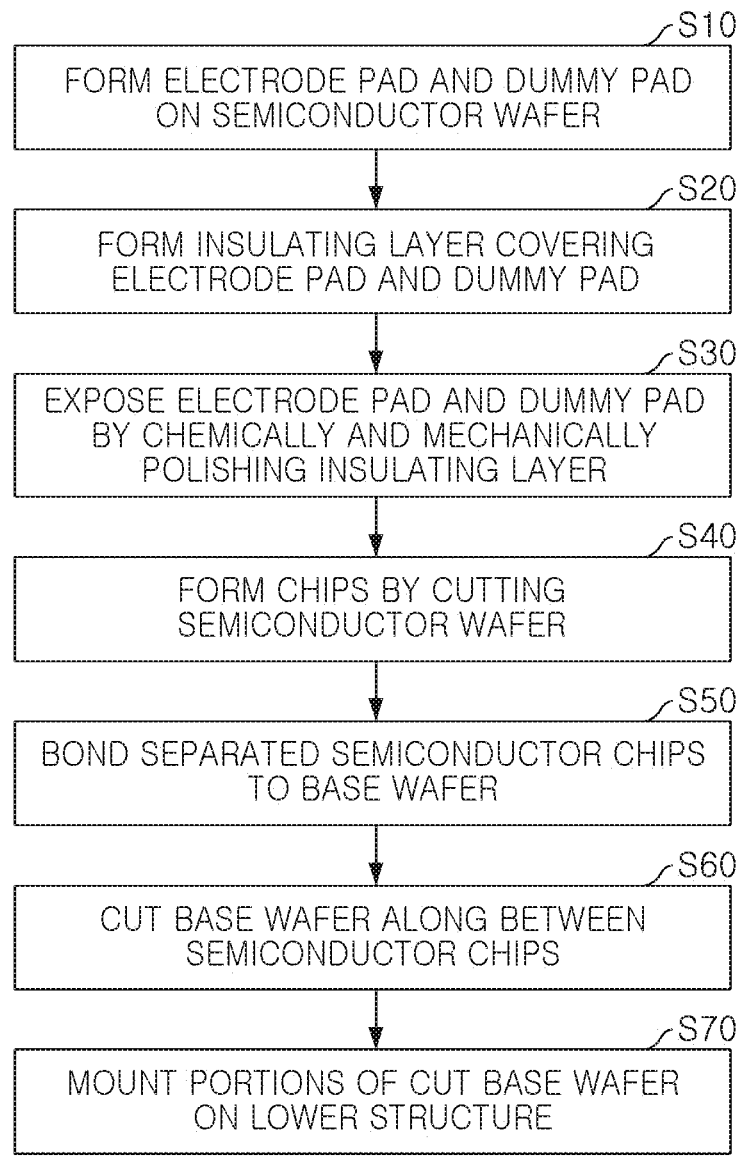
FIG. 11 is a process flow diagram illustrating an example embodiment of a method of forming a semiconductor package according to an example embodiment of the present disclosure.

Next, an example embodiment of a method of forming a semiconductor package according to the example embodiment of the present disclosure will be described with reference to FIGS. 11 and 16. FIG. 11 is a process flow diagram illustrating an example of a method of forming a semiconductor package according to an example embodiment of the present disclosure, and FIGS. 12 to 16 are cross-sectional views illustrating an example of the method of forming a semiconductor package according to the example embodiment of the present disclosure.

Figure 12:
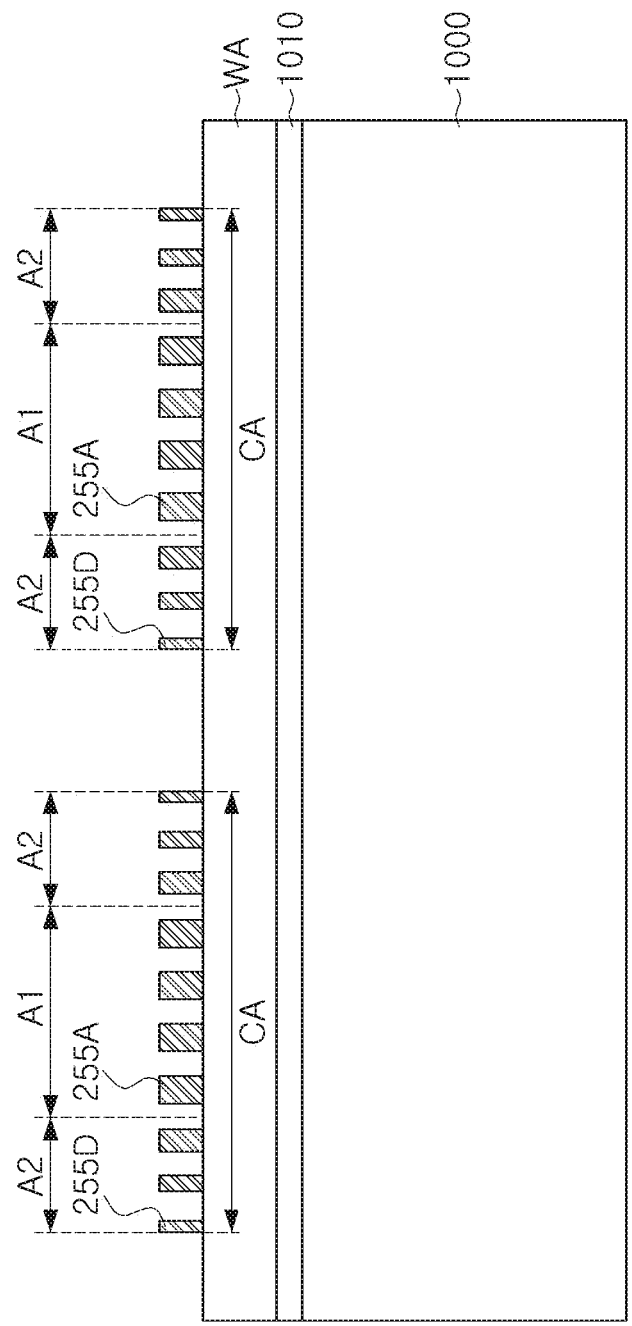
FIGS. 12 to 17 are cross-sectional views illustrating the example embodiment of the method of forming a semiconductor package according to the example embodiment of the present disclosure.

Referring to FIGS. 11 and 12, in operation S10, an electrode pad 255A and a dummy pad 255D may be formed on a semiconductor wafer WA having chip areas CA in units of chip areas CA. For example, the electrode pad 255A may be formed in the first area A1 which is a central area of the chip areas CA, and the dummy pad 255D may be formed in the second area A2 which is a circumferential area of the chip areas CA. The semiconductor wafer WA may be provided while being attached to a carrier substrate 1000 by an adhesive layer 1010 on the carrier substrate 1000.

Figure 13:
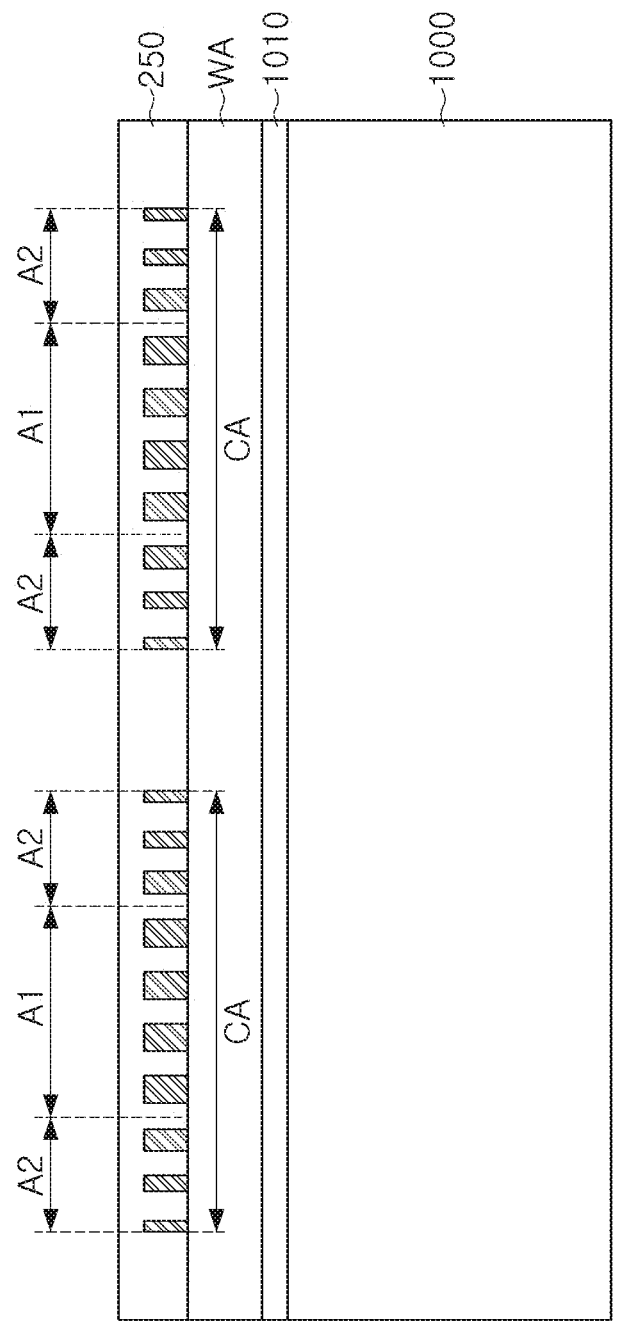

Referring to FIGS. 11 and 13, in operation S20, a lower insulating layer 250 covering the lower electrode pad 255A and the lower dummy pad 255D may be formed on the semiconductor wafer WA.

Figure 14:
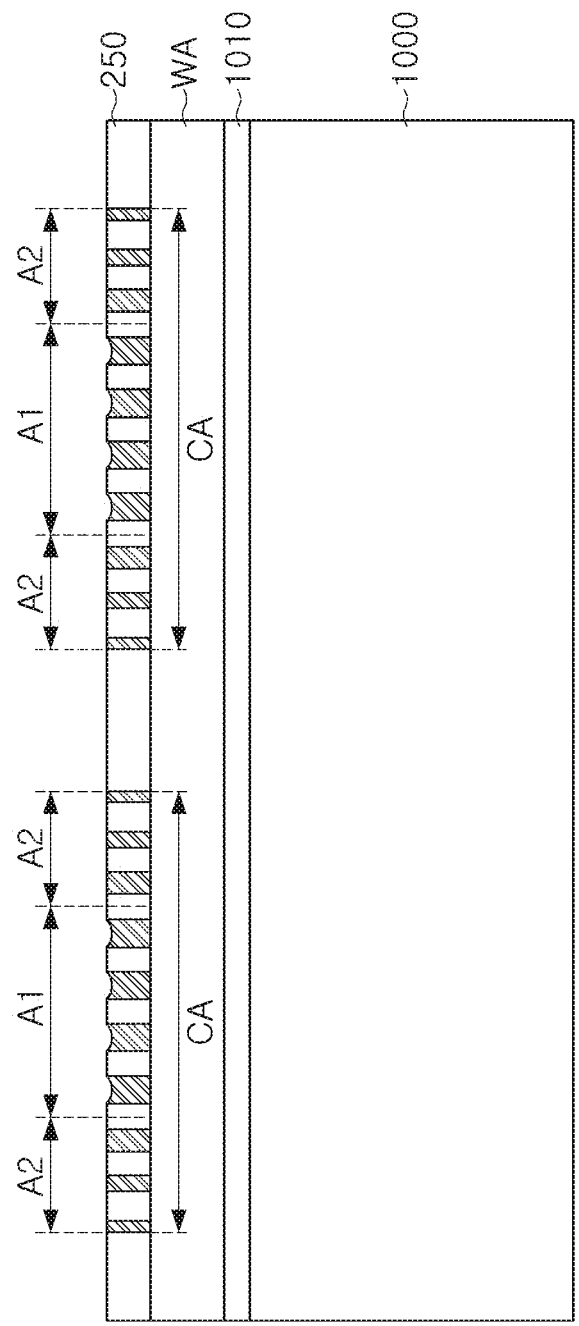

Referring to FIGS. 11 and 14, in operation S30, the surface of the lower insulating layer 250 may be planarized so that the lower electrode pad 255A and the lower dummy pad 255D are exposed. The planarization may be performed using the CMP process. The lower dummy pad 255D may be disposed around the lower electrode pad 255A, and in the CMP process, the difference in removal rate between the area in which the lower electrode pad 255A is disposed and the area (for example, a scribe line) in which the lower electrode pad 255A is not disposed may be alleviated. Accordingly, the occurrence of the erosion phenomenon in which the area where the lower electrode pad 255A is not disposed may be convex may be inhibited (or, alternatively, prevented).

Figure 15:
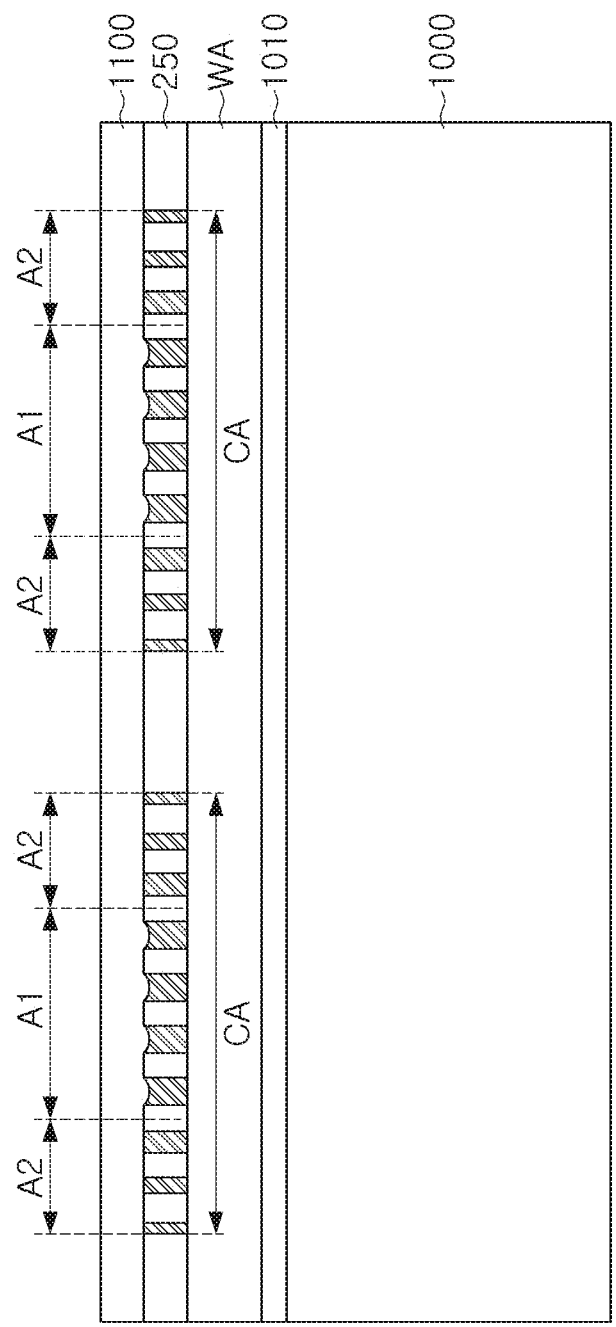
Figure 16:
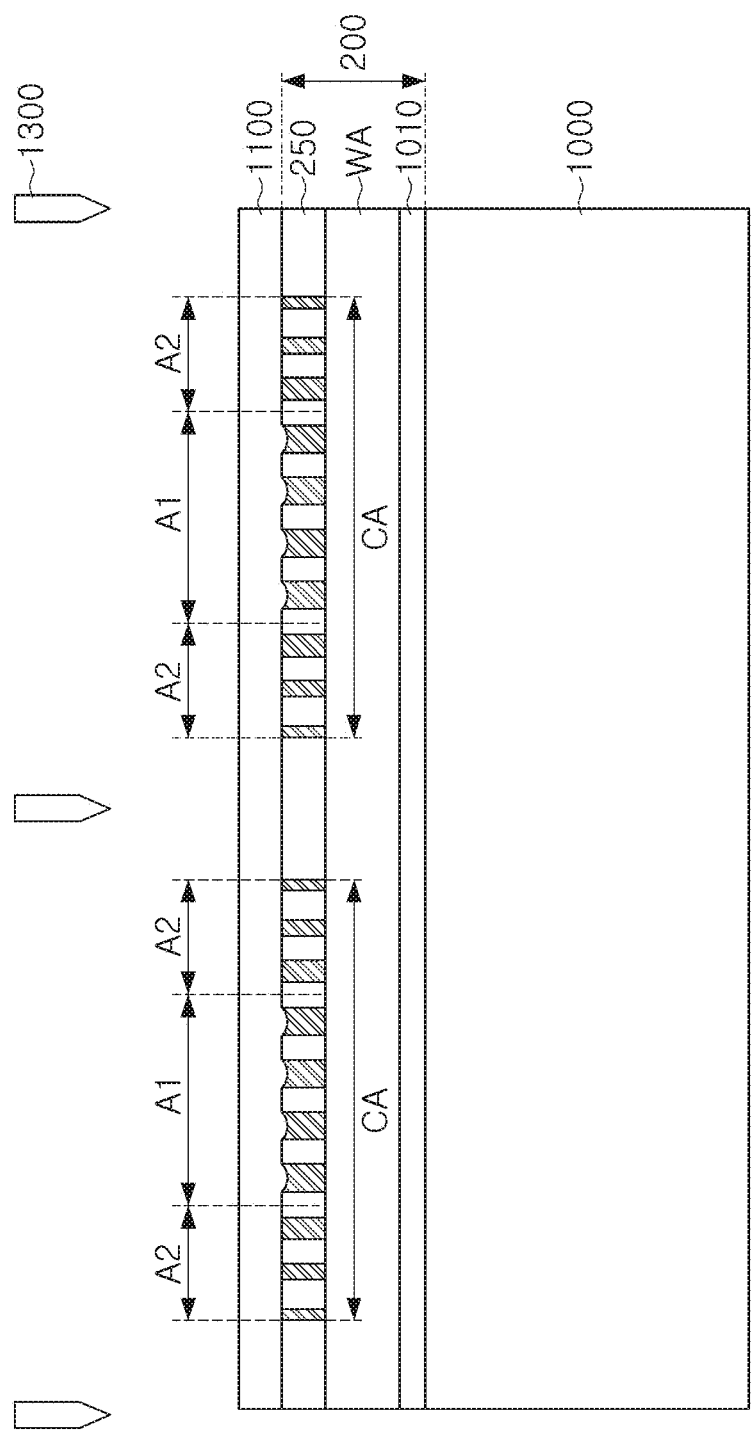

Referring to FIGS. 11 and 15, a protective layer 1100 covering the lower insulating layer 250, the lower electrode pad 250A, and the lower dummy pad 255D may be formed on the semiconductor wafer WA. The protective layer 1100 may protect the lower insulating layer 250, the lower electrode pad 250A, and the lower dummy pad 255D in the process of forming the semiconductor chip by cutting the semiconductor wafer WA.

Figure 17:
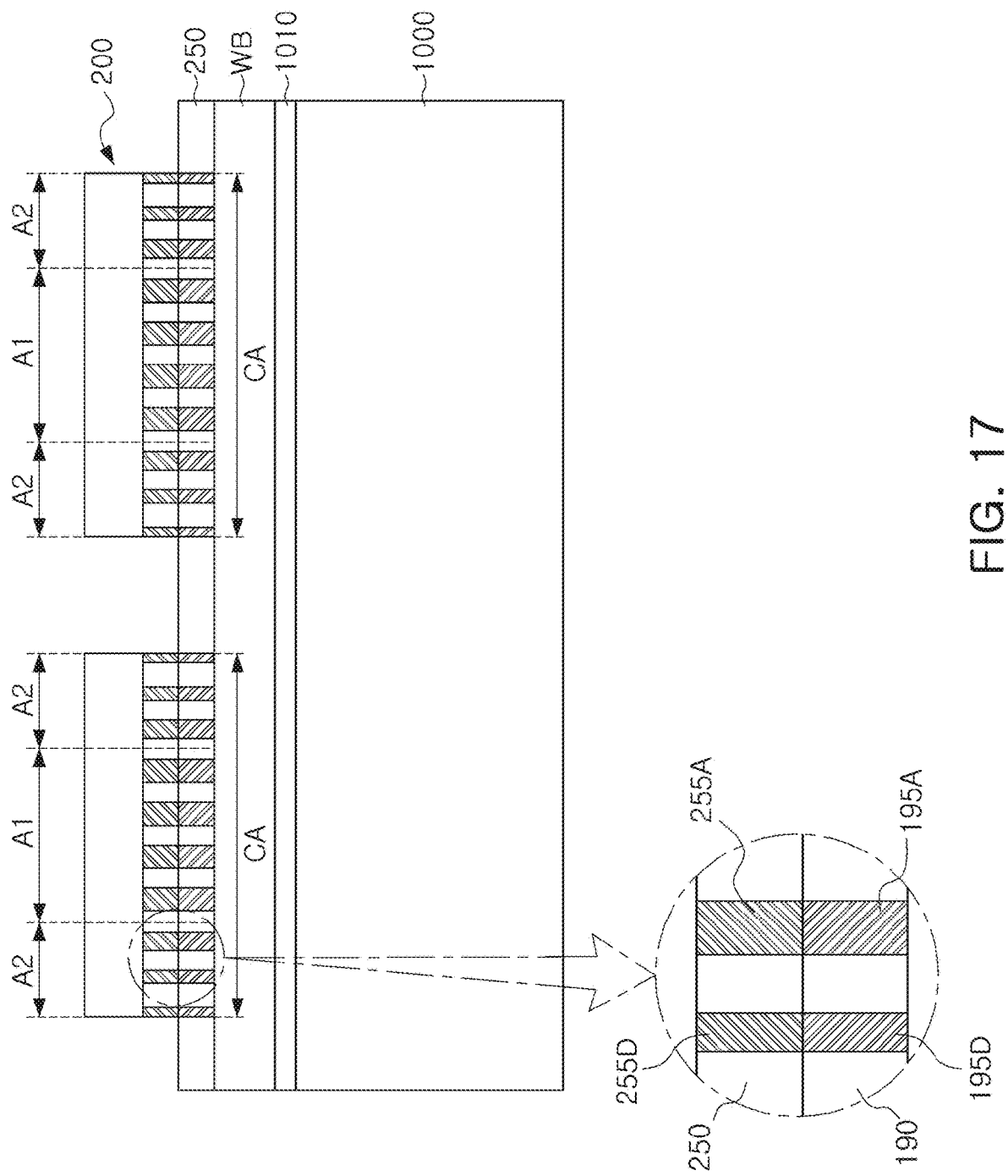

Referring to FIGS. 11, 16, and 17, in operation S40, the semiconductor chips 200 may be formed by cutting between the chip areas CA of the semiconductor wafer WA. The semiconductor wafer WA may be cut using a sawing device 1300. The protective layer 1100 remaining on the semiconductor chips 200 may be removed.

In operation S50, the semiconductor chips 200 may be separated from the adhesive layer 1010 of the carrier substrate 1000, and the separated semiconductor chips 200 may be bonded to a base wafer WB.

The base wafer WB may include the upper insulating layer 190 and the upper pad 195. The lower insulating layer 250 of the semiconductor chips 200 may be coupled while being in contact with the upper insulating layer 190, and the lower electrode pad 255 and the lower dummy pad 255D of the semiconductor chips 200 may be coupled while being in contact with the upper electrode pad 195A and the upper dummy pad 195D.

Bonding the semiconductor chips 200 to the base wafer WB may place the semiconductor chips 200 on the base wafer WB, and may bond and couple the upper insulating layer 190 of the base wafer WB to the lower insulating layer 250 of the semiconductor chips 200 while bonding and coupling the upper pads 195 and the upper dummy pads 195D of the base wafer WB to the lower electrode pads 255A and the lower dummy pads 255D of the semiconductor chips 200 by applying pressure to the semiconductor chips 200 under a thermal atmosphere higher than room temperature, for example, a thermal atmosphere of about 200° C. to about 300° C. Here, the temperature of the thermal atmosphere may be variously changed while being limited to about 200° C. to about 300° C. The upper pads 195, the upper dummy pads 195D, the lower electrode pads 255A, and the lower dummy pads 255D may be bonded to each other through metal diffusion, and the upper insulating layer 190 and the lower insulating layer 250 of the semiconductor chips 200 may be bonded to each other through covalent bonding.

Referring to FIGS. 1 and 11, in operation S60, the base wafer WB may be cut between the semiconductor chips 200. Before cutting the base wafer WB, the method may further include forming a mold layer 310 covering the semiconductor chips 200. Accordingly, the mold layer 310 may also be cut while cutting the base wafer WB.

In operation S70, parts of the cut base wafer WB may be mounted on the lower structure 100. Accordingly, the semiconductor package 1A as described in FIG. 1 may be formed.

According to the example embodiments of the present inventive concepts, the lower structure 100 may be regarded as a lower chip located relatively low, and the semiconductor chip 200 may be regarded as an upper chip located relatively high. The semiconductor package including the pads 195A, 195D and 255A, 255D coupled while in direct contact with each other and the lower and upper chips 100 and 200 coupled by the insulating layers 190 and 250 coupled while being in direct contact with each other may be provided.

According to example embodiments of the present inventive concepts, it is possible to provide the semiconductor package including the pads coupled while being in direct contact with each other and the insulating layers coupled while being in direct contact with each other. Accordingly, the pads and the insulating layers may couple the chips. Such pads and insulating layers may couple the chips or the chip and the interposer, thereby reducing the thickness of a semiconductor package.

According to example embodiments of the present inventive concepts, the chips to be directly coupled may include an area in which the dummy pads are arranged around an area in which the electrode pads are arranged. The area in which the dummy pads are arranged may improve the reliability of the semiconductor package in which the semiconductor chips are stacked by reducing the step difference on the surface of the semiconductor chip in the process of planarizing the surface of the semiconductor chip before the semiconductor chips are staked.

Various and beneficial advantages and effects of the present disclosure are not limited to the above description, and may be more easily understood in the course of describing the specific example embodiments of the present disclosure.

The present disclosure is not limited to the above-described embodiments and the accompanying drawings, but is intended to be limited to the appended claims. Accordingly, various types of substitutions, modifications and changes will be possible by those of ordinary skill in the art without departing from the present inventive concepts described in the claims, and belong to the scope of the present disclosure.

What is claimed is:

1. A semiconductor package, comprising:
an upper structure including an upper insulating layer, first upper pads and second upper pads, the first upper pads disposed in a first area and having the same size, the second upper pads being around the first area and having a plurality of sizes, and the upper insulating layer covering side surfaces of the first upper pads and the second upper pads; and a lower structure including a lower insulating layer, first lower pads and second lower pads, the lower insulating layer being bonded to the upper insulating layer, the first lower pads bonded to the first upper pads, respectively, and the second lower pads being around the first lower pads and bonded to the second upper pads, respectively,
 wherein sizes of the second upper pads are different from the first upper pads and decrease with distance from the first area.

2. The semiconductor package of claim 1, wherein each of the second upper pads is smaller than the first upper pads.

3. The semiconductor package of claim 1, wherein a ratio of a surface area per unit area of the second upper pads to the upper insulating layer on a lower surface of the upper insulating layer gradually decreasing toward a side of the upper structure.

4. The semiconductor package of claim 1, wherein a ratio of a surface area per unit area of the second lower pads to the lower insulating layer on an upper surface of the second insulating layer gradually decreases toward a side of the lower structure.

5. The semiconductor package of claim 1, wherein the first upper pads have a pitch of 20 μm or less.

6. The semiconductor package of claim 1, wherein each of the second lower pads has the same size as corresponding one of the second upper pads.

7. The semiconductor package of claim 1, wherein the first upper pads have a uniform pitch.

8. The semiconductor package of claim 1, wherein the sizes of the second upper pads decrease toward a side of the upper structure.

9. The semiconductor package of claim 1, wherein the upper structure further includes an upper body, an upper internal circuit area below the upper body and upper through electrodes penetrating the upper body, and
 wherein at least one of the first upper pads is electrically connected to one among the upper through electrodes.

10. The semiconductor package of claim 1, wherein the lower structure further includes a lower body and lower through electrodes penetrating the lower body, and
 wherein at least one of the first lower pads is electrically connected to one among the lower through electrodes.

11. The semiconductor package of claim 10, wherein at least one of the first lower pads is directly in contact with one among the lower through electrodes.

12. The semiconductor package of claim 1, wherein the second upper pads are disposed in a second area, and wherein the second area surrounds the first area.

13. The semiconductor package of claim 1, wherein the first area includes a third area and a fourth area, and wherein, between the third area and the fourth area, the sizes of the second upper pads decrease with distance from boundaries of the third area and the fourth area.

14. The semiconductor package of claim 13, wherein, between the third area and the fourth area, a ratio of a surface area per unit area of the second upper pads to the upper insulating layer on a lower surface of the upper insulating layer gradually decreasing with distance from the boundaries of the third area and the fourth area.

15. A semiconductor package, comprising:
 an upper structure including an upper insulating layer, first upper pads and second upper pads, the first upper pads disposed in a central area and having the same size, the second upper pads being around the central area, and the upper insulating layer covering side surfaces of the first upper pads and the second upper pads; and
 a lower structure including a lower insulating layer, first lower pads and second lower pads, the lower insulating layer being bonded to the upper insulating layer, the first lower pads bonded to the first upper pads, respectively, and the second lower pads being around the first lower pads and bonded to the second upper pads, respectively,
  wherein a pitch of the second upper pads gradually increases with distance from the central area.

16. The semiconductor package of claim 15, wherein a ratio of a surface area per unit area of the second upper pads to the upper insulating layer on a lower surface of the upper insulating layer gradually decreasing toward a side of the upper structure.

17. The semiconductor package of claim 15, wherein the second upper pads have the same size.

18. The semiconductor package of claim 15, wherein the pitch of the second upper pads gradually increases toward a side of the upper structure.

19. The semiconductor package of claim 15, wherein the pitch of the second upper pads is 0.3 μm to 0.5 μm.

20. A semiconductor package, comprising:
 an upper structure including an upper insulating layer, first upper pads and second upper pads, the first upper pads disposed in a central area and having the same size, the second upper pads being around the central area, and the upper insulating layer covering side surfaces of the first upper pads and the second upper pads; and
 a lower structure including a lower insulating layer, first lower pads and second lower pads, the lower insulating layer being bonded to the upper insulating layer, the first lower pads bonded to the first upper pads, respectively, and the second lower pads being around the first lower pads and bonded to the second upper pads, respectively,
  wherein sizes of the second upper pads are different from the first upper pads and decrease with distance from the central area, and
  wherein a pitch of the second upper pads gradually increases with distance from the central area.

* * * * *